(12) United States Patent
Tanaka et al.

(10) Patent No.: US 8,071,475 B2
(45) Date of Patent: Dec. 6, 2011

(54) LINER FOR TUNGSTEN/SILICON DIOXIDE INTERFACE IN MEMORY

(75) Inventors: Yoichiro Tanaka, Santa Clara, CA (US); Steven J. Radigan, Fremont, CA (US); Usha Raghuram, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 668 days.

(21) Appl. No.: 11/863,734

(22) Filed: Sep. 28, 2007

(65) Prior Publication Data

US 2009/0085087 A1   Apr. 2, 2009

(51) Int. Cl.
*H01L 21/44* (2006.01)
(52) U.S. Cl. .................. 438/671; 257/E21.023
(58) Field of Classification Search .......... 257/46, 257/104, 594, 601, 656, E29.329, E21.023; 438/671, 717, 736, 945
See application file for complete search history.

(56) References Cited

U.S. PATENT DOCUMENTS

| | | | |
|---|---|---|---|
| 4,929,569 A * | 5/1990 | Yaniv et al. ................. | 438/27 |
| 6,153,537 A | 11/2000 | Bacchetta et al. | |
| 6,952,030 B2 | 10/2005 | Herner et al. | |
| 6,969,685 B1 | 11/2005 | Li et al. | |
| 6,972,252 B1 | 12/2005 | Sanganeria et al. | |
| 7,575,984 B2 * | 8/2009 | Radigan et al. ............ | 438/467 |
| 2001/0035582 A1 | 11/2001 | Tesauro et al. | |
| 2006/0006495 A1 * | 1/2006 | Herner et al. ............. | 257/530 |
| 2007/0054491 A1 | 3/2007 | Chen | |

FOREIGN PATENT DOCUMENTS

| | | |
|---|---|---|
| EP | 1 796 103 A2 | 6/2007 |
| WO | WO 2007/075568 A2 | 7/2007 |

OTHER PUBLICATIONS

International Search Report and Written Opinion dated Jan. 30, 2009, received in corresponding application No. PCT/US2008/011216.
U.S. Appl. No. 10/955,549.
U.S. Appl. No. 11/148,530.
U.S. Appl. No. 11/149,325.
U.S. Appl. No. 11/311,841.
U.S. Appl. No. 10/165,393.

* cited by examiner

*Primary Examiner* — Quoc Hoang
(74) *Attorney, Agent, or Firm* — The Marbury Law Group, PLLC

(57) ABSTRACT

A semiconductor wafer assembly includes a base of dielectric. A layer of silicon is deposited thereover. A metal hard mask is deposited over the silicon. A dielectric hard mask is deposited over the metal hard mask. Photoresist is deposited over the dielectric hard mask, whereby a plurality of sacrificial columns is formed from the layer of metal hard mask through the photoresist such that the sacrificial columns extend out from the silicon layer. An interface layer is disposed between the layer of conductive material and the layer of hard mask to enhance adhesion between each of the plurality of sacrificial columns and the layer of conductive material to optimize the formation of junction diodes out of the silicon by preventing the plurality of sacrificial columns from being detached from the layer of silicon prematurely due to the sacrificial columns peeling or falling off.

25 Claims, 6 Drawing Sheets ic. A layer of silicon is deposited thereover. A metal hard mask is deposited over the silicon. A dielectric hard mask is deposited over the metal hard mask. Photoresist is deposited over the dielectric hard mask, whereby a plurality of sacrificial columns is formed from the layer of metal hard mask through the photoresist such that the sacrificial columns extend out from the silicon layer. An interface layer is disposed between the layer of conductive material and the layer of hard mask to enhance adhesion between each of the plurality of sacrificial columns and the layer of conductive material to optimize the formation of junction diodes out of the silicon by preventing the plurality of sacrificial columns from being detached from the layer of silicon prematurely.

LINER FOR TUNGSTEN/SILICON DIOXIDE INTERFACE IN MEMORY

BACKGROUND ART

The invention generally relates to a structure used to enhance the integrity of devices formed on a semiconductor wafer. More particularly, the invention relates to a structure used to enhance the integrity of devices formed generally perpendicular to a semiconductor wafer.

Devices made from semiconductor materials are used to create memory circuits in electrical components and systems. Memory circuits are the backbone of such devices as data and instruction sets are stored therein. Minimizing the amount of natural resources and space consumed by memory circuits is a primary motivation in the designing of such circuits. As the design of memory circuits has moved from two-dimensional designs to three-dimensional designs, more emphasis is being made to minimize the space required to build structures, while maintain the integrity and strength of same, which becomes more important as more elements are incorporated into a space, the greater the cost in having to replace that component should one element therein fail.

Electrical connections between dielectric layers and electrical components of an integrated circuit are required to be strong. Likewise, the electrical components themselves must be strong enough to endure harsh environmental conditions during continued manufacturing processes and a subsequent use life. Therefore, the connections between the electrical components and the wafer must be strong.

Countering the principal of strength is the requirement to make electrical components smaller and more compact with respect to each other. As the electrical component gets smaller to accommodate the compression requirements, the electrical component is weakened. Hence, the ability to maintain the electrical component on the semiconductor wafer is reduced, resulting in a higher rate of failure.

SUMMARY OF THE INVENTION

A semiconductor wafer assembly includes a base of dielectric. A layer of silicon is deposited thereover. A metal hard mask is deposited over the silicon. A dielectric hard mask is deposited over the metal hard mask. Photoresist is deposited over the dielectric hard mask, whereby a plurality of sacrificial columns is formed from the layer of metal hard mask through the photoresist such that the sacrificial columns extend out from the silicon layer. An interface layer is disposed between the layer of conductive material and the layer of hard mask to enhance adhesion between each of the plurality of sacrificial columns and the layer of conductive material to optimize the formation of junction diodes out of the silicon by preventing the plurality of sacrificial columns from being detached from the layer of silicon prematurely.

BRIEF DESCRIPTION OF THE DRAWINGS

Advantages of the invention will be readily appreciated as the same becomes better understood by reference to the following detailed description when considered in connection with the accompanying drawings, wherein.

DETAILED DESCRIPTION OF THE PREFERRED EMBODIMENT

Figure 1:
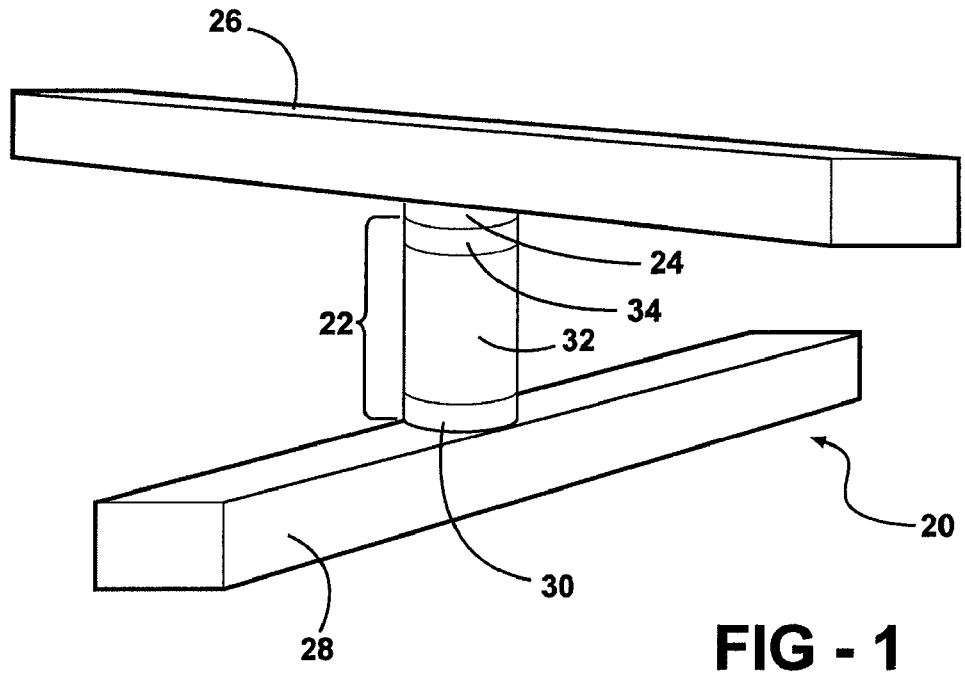
FIG. 1 is a perspective view of a prior art nonvolatile memory cell formed without the inventive structure nor using the inventive method.

Referring to FIG. 1, U.S. Pat. No. 6,952,030, issued to Herner et al. and entitled "High-Density Three-Dimensional Memory Cell," hereinafter the "'030 patent" and hereby incorporated by reference, discloses a nonvolatile memory cell, generally indicated at 20, including a vertically oriented junction diode 22 and a dielectric rupture antifuse 24 interposed between top 26 and bottom 28 conductors. The vertically oriented junction diode 22 includes a heavily doped semiconductor layer 30 of a first conductivity type, an intermediate layer 32 which is undoped semiconductor material or lightly doped semiconductor material, and a heavily doped semiconductor layer 34 of the second conductivity type. The semiconductor material of the junction diode 22 is generally silicon, germanium, or an alloy of silicon and/or germanium. The junction diode 22 and the dielectric rupture antifuse 24 are arranged in series between the bottom conductor 28 and the top conductor 26, which may be formed of a metal such as tungsten.

The term junction diode is used herein to refer to a semiconductor device with the property of non-ohmic conduction, having two terminal electrodes, and made of semiconducting material which is p-type at one electrode and n-type at the other. Examples include p-n diodes and n-p diodes, which have a p-type semiconductor material and an n-type semiconductor material in contact, such as Zener diodes, and p-i-n diodes, in which an intrinsic (undoped) semiconductor material is interposed between the p-type semiconductor material and the n-type semiconductor material.

In the initial state of the memory cell 20 of FIG. 1, very little current flows through the junction diode 22 when a read voltage is applied between the top conductor 26 and the bottom conductor 28. The antifuse 24 impedes current flow, and in most embodiments, the polycrystalline semiconductor material of diode 22 is formed in a relatively high-resistive state, as described in a U.S. patent application having Ser. No. 10/955,549, "Nonvolatile Memory Cell Without a Dielectric Antifuse Having High- and Low-Impedance States," filed by Herner et al. on Sep. 29, 2004 and hereinafter the "'549 application"; and U.S. patent application having Ser. No. 11/148,530, "Nonvolatile Memory Cell Operating by Increasing Order in Polycrystalline Semiconductor Material," filed by Herner et al. on Jun. 8, 2005 and hereinafter the "'530 application," both hereby incorporated by reference. The application of a programming voltage between the top conductor 26 and bottom conductor 28 causes dielectric breakdown of the antifuse material, permanently forming a conductive path through the antifuse 24. The semiconductor material of diode 22 is altered as well, changing it to a lower-resistive state. After programming, a readily detectable current flows between the top conductor 26 and the bottom conductor 28 upon application of a read voltage. In this way, a programmed cell can be distinguished from an unprogrammed cell.

Figure 2:
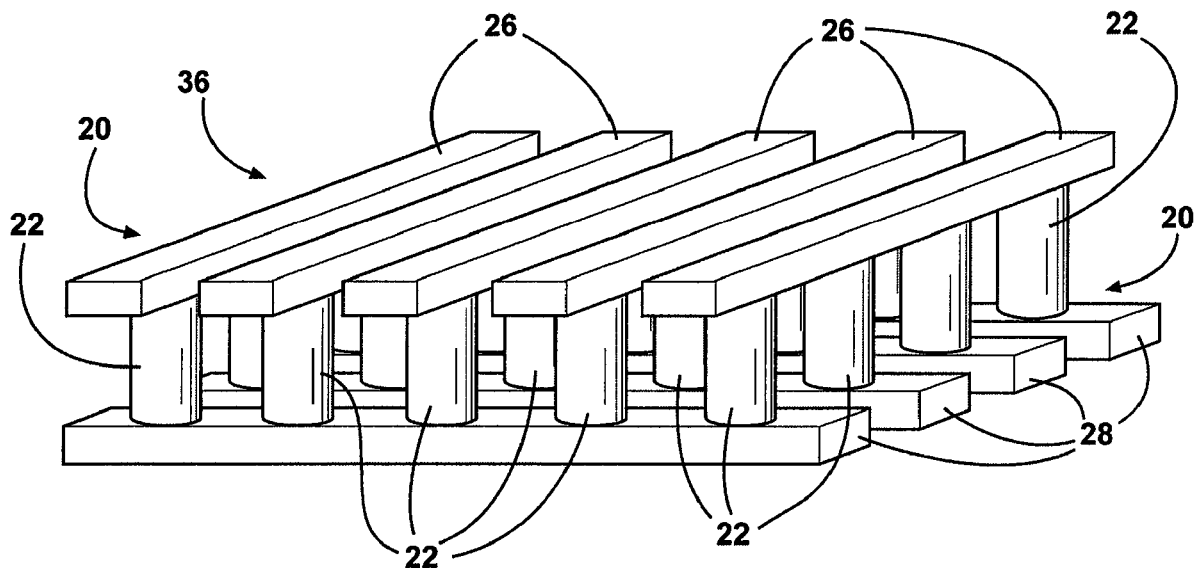
FIG. 2 is a perspective view of a portion of a first memory cell of FIG. 1.

Referring to FIG. 2, a portion of a first memory level 36 of memory cells 20 similar to the cell 20 of FIG. 1 is shown. Two, three, four, or more such memory levels may be formed, stacked one atop the other, to form a monolithic three dimensional memory array, preferably formed above a semiconductor substrate such as a monocrystalline silicon wafer, and described in the '030 patent and the '549 and '530 applications.

Features in semiconductor devices such as the memory cell 20 are generally formed either by subtractive or by Damascene methods. In a subtractive method, a material is patterned and etched into a desired shape. Gaps are then etched between features and filled with dielectric. In a Damascene method, features are formed by forming voids in dielectric, then filling those voids with conductive or semiconductor material.

Figure 3A:
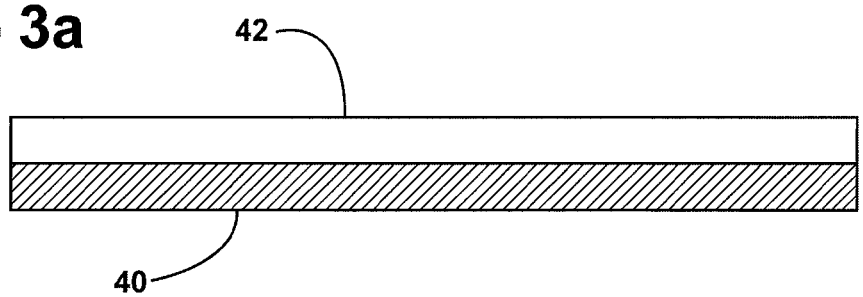
FIGS. 3a through 3d are cross-sectional side views illustrating steps in the process of forming conductive rails by a subtractive method.
Figure 3B:
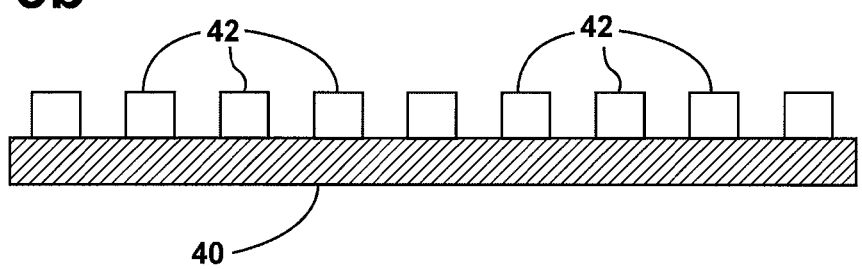
Figure 3C:
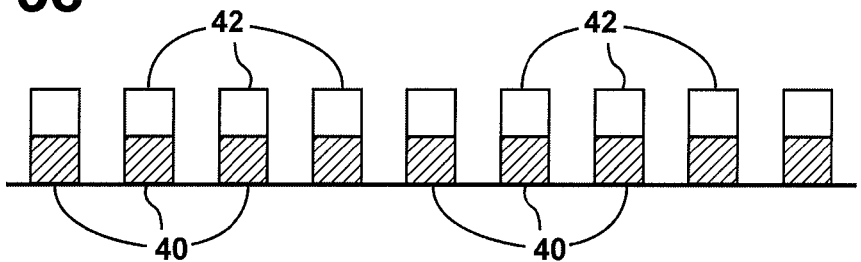
Figure 3D:
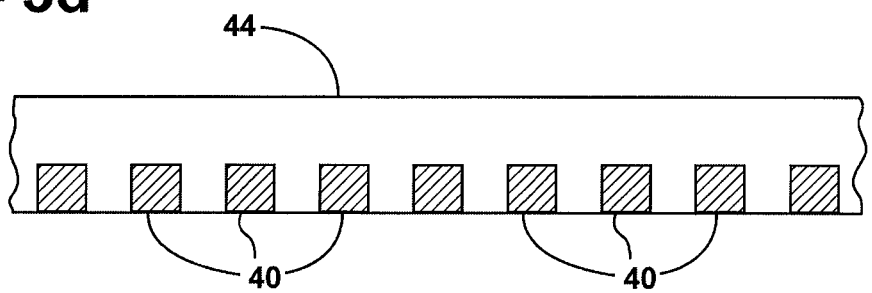

For example, to form metal rail-shaped conductors using the subtractive method, as shown in FIG. 3a, a metal layer 40 is deposited, and a layer of photoresist 42 is spun onto it. As shown in FIG. 3b, the layer of photoresist 42 is then photolithographically patterned into the desired form. As shown in FIG. 3c, an etch step removes portions of the metal layer 40 where it is not protected by etched photoresist layer 42. As shown in FIG. 3d, after the etch, the photoresist layer 42 is stripped, leaving metal rails 40 behind, with gaps between the rails 40, which can be filled by a dielectric 44. If desired, any overfill of the dielectric 44 can be removed, for example by chemical-mechanical planarization (CMP), to expose the metal rails 40 at a planarized surface.

Figure 4A:
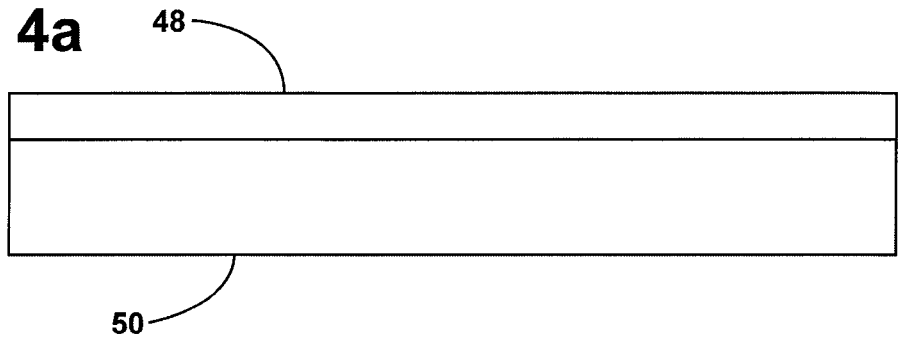
FIGS. 4a through 4d are cross-sectional side views illustrating steps in the process of forming conductive rails by a Damascene method.
Figure 4B:
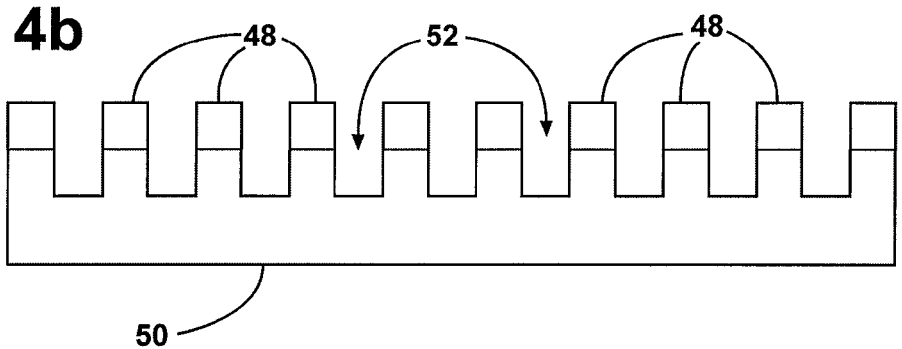
Figure 4C:
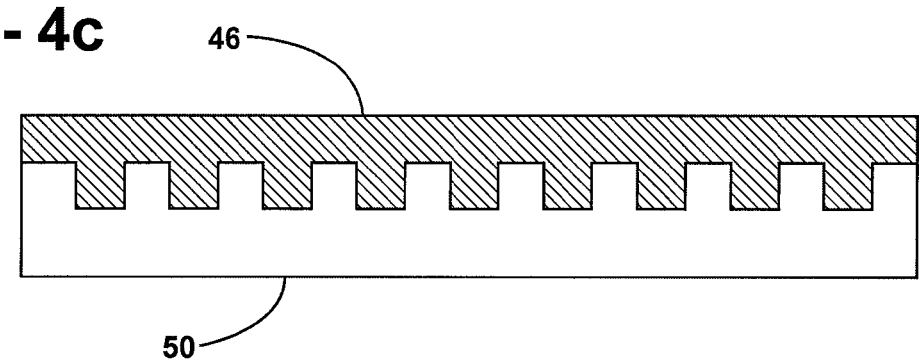
Figure 4D:
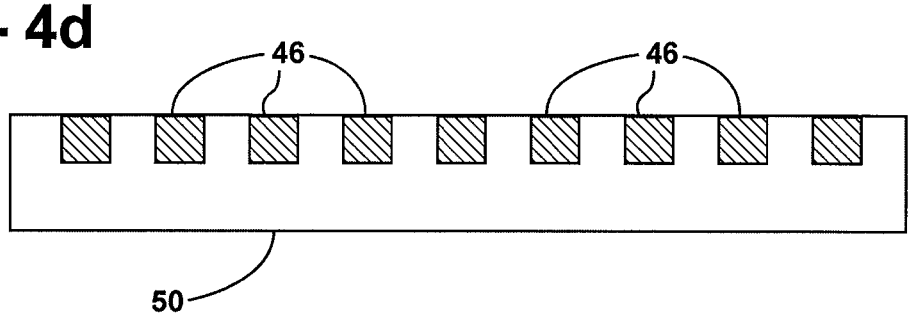

To contrast the example shown in FIGS. 3a through 3d, FIG. 4a illustrates the first step in forming metal rail-shaped conductors 46 using a Damascene method. First, a layer of photoresist 48 is spun onto a deposited oxide layer 50. As shown in FIG. 4b, the layer of photoresist 48 is patterned. An etch step then forms trenches 52 in the oxide layer 50. In FIG. 4c, after removal of the photoresist layer 48, the layer of metal 46 is deposited to fill the trenches 52, and the overfill removed, for example by CMP, to form the rails 46, shown in FIG. 4d.

In the embodiment of the '030 patent, shown in FIG. 1, the bottom conductors 28 and the top conductors 26 are formed by subtractive methods. In some embodiments, it may be desirable to form these conductors using a Damascene method.

Figure 5A:
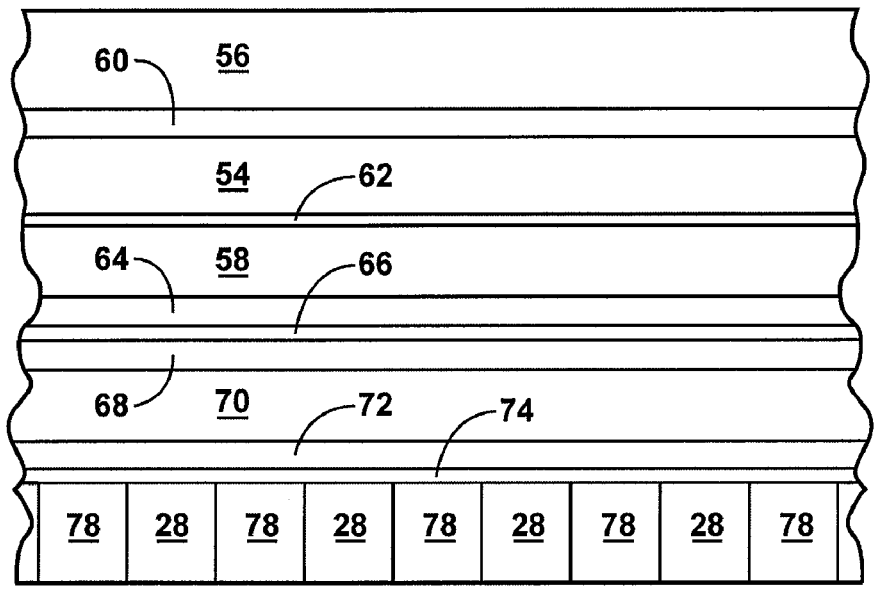
FIGS. 5a through 5g are cross-sectional side views of a semiconductor wafer through the steps in the process of forming elements using the invention.

The junction diodes 22 extend generally between these two conductors 26, 28 (there may be layers intermediate between the junction diodes 22 and the two conductors 26, 28). The junction diodes 22 are prone to fail due to should a portion of a photoresist or hard mask layers fail to adhere or peel during the fabrication steps. This failure may occur during the etching and forming steps. In the embodiment shown in FIG. 5a, a layer of dielectric hard mask 54 generally exists between the layer of photoresist 56 and a layer of metal hard mask 58. The metal hard mask 58 may be fabricated from tungsten. Alternatively, a tungsten composite or alloy can be used.

A hard mask is an etched layer that serves to pattern the etch of an underlying layer(s); if all of the photoresist has been consumed, the layers of hard mask 54, 58 can provide the pattern in its stead. The use of porous low-k layers, in addition to the reduced dimensions of electrical components being fabricated, requires the presence of the metal hard mask 58. A metal hard mask 58 provides the best protection against resist poisoning, and works well for the porous low-k films. In the embodiment shown, a layer of dielectric anti-reflective coating 60 (DARC) may be used to facilitate the fabrication of the junction diodes 22. The DARC layer 60 prevents off-axis erosion of the photoresist layer 56 that may otherwise occur during subsequent processing steps due to the reflection of light in the etching process.

Below the layer of metal hard mask 58 is a layer of interface material 62. Because the metal hard mask 58, dielectric hard mask 54 and photoresist 56 layers are required for a plurality of fabrication steps, they tend to break away from the silicon layers, discussed subsequently, that are being formed into the junction diodes 22. This results in the failure of forming the pillar structures thereunder. The interface layer 62 is a thin adhesive layer that is applied to the structure between the dielectric 54 and metal 58 hard mask layers. The interface layer 62 provides sufficient adhesion to prevent the etched hard mask and photoresist from breaking from the layer of metal hard mask layer 58. The interface layer 62 adheres or glues the dielectric hard mask layer 54 to the metal hard mask layer 58 during subsequent fabrication, which enhances the productivity and quality of the memory device being manufactured. Because the interface layer 62 is conductive, it and the metal hard mask layer 58 may remain in or on the device without affecting the performance of the memory device being manufactured, should it be desired to leave it or ignore it during subsequent processing steps. The interface layer 62, fabricated from titanium nitride or tungsten nitride using standard reactive PVD and/or CVD methods, will be discussed in greater detail subsequently.

Below the layer of metal hard mask 58 is a layer of adhesive 64 which aids in the adhesion between the layer of metal 58 and a layer of antifuse material 66, disposed below the layer of metal hard mask 58. The layer of antifuse material 66 is used for the purpose of forming the dielectric rupture antifuse 24, discussed above. In many embodiments, the material used to create the layer of adhesive 64 between the layer of metal hard mask 58 and the layer of antifuse material 66 is TiN.

Directly below the layer of antifuse material 66 are three layers of silicon 68, 70, 72. The three layers of silicon 68, 70, 72 include the heavily doped layer of silicon 68, an intermediate layer of silicon 70, which is undoped or lightly doped, and another heavily doped layer of silicon 72. Each of these layers 68, 70, 72 are used in the fabrication of the heavily doped semiconductor layer 30, intermediate layer 32 and heavily doped semiconductor layer 34, all of which form the vertically oriented junction diode 22, discussed in greater detail above. A subsequent layer of adhesive 74, typically TiN, is deposited below the layers of silicon 68, 70, 72.

The bottom of the device includes a layer of conductors 28. The conductors 28 are fabricated from tungsten, or an alloy thereof, and are fabricated using one of the methods discussed above. Spacers 78, made of an inert material such as silicon dioxide, separate the conductors from each other. While the bottom layer of adhesive 74 may extend between each of the conductors 28 and spacers 78, it is typically not present unless the layer of conductors 28 are fabricated using the Damascene method.

Figure 5B:
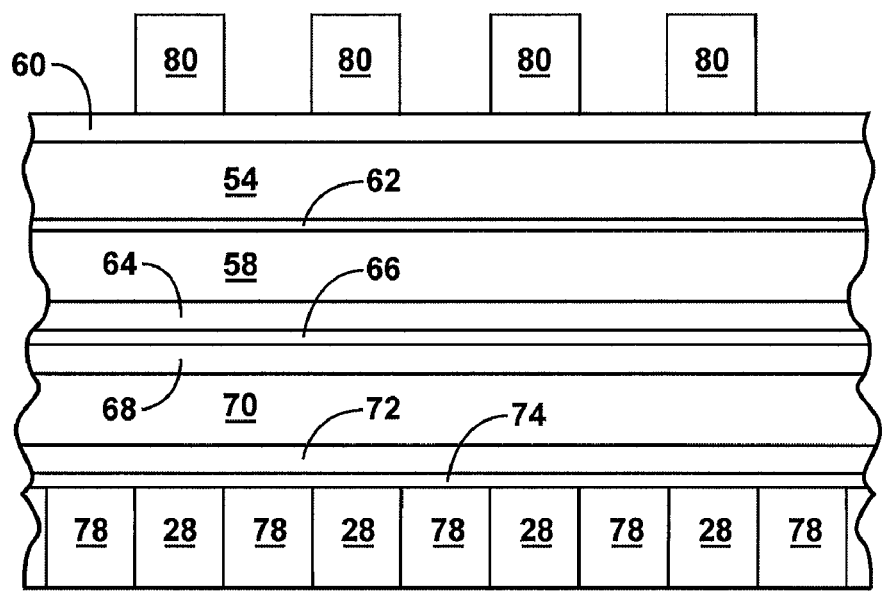

The structure described above in the paragraphs immediately preceding is the structure that will be used to form the junction diodes 22. The first step of the fabrication process is shown in FIG. 5b. In this step the layer of photoresist 56 is patterned to create a mask 80. The photoresist mask 80 will be used to pattern the hard mask layer 54 and the layers disposed therebelow.

Figure 5C:
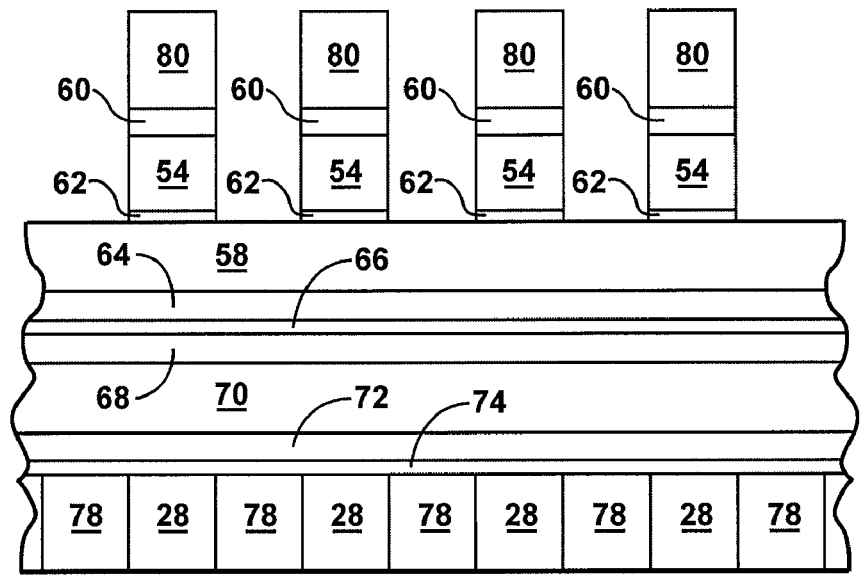

Referring to FIG. 5c, the structure is further processed by etching away the DARC layer 60, the dielectric hard mask layer 54, the metal hard mask 58 and the interface layer 62. The remaining portions of these layers 54, 58, 60, 62 and the photoresist mask 80 form sacrificial columns 82 and are present and used to form the junction diodes 22. These sacrificial columns 82 define a mask pattern for subsequent etching steps. In order to maximize the performance of the process, the interface layer 62 is used to reduce the number of sacrificial columns 82 that are destroyed, detached, peel off or fall off prior to the time in which the sacrificial columns 82 are no longer needed and can be removed. By retaining the sacrificial columns 82 until they are no longer needed provides for a higher percentage of the desired junction diodes 22 being formed during the fabrication process. The examples set forth below help illustrate the effectiveness of incorporating the interface layer 62 into the structure. The interface layer 62 is required to not interfere with the top conductors 26 being formed thereunder so as to not require an additional processing step to remove the interface layer 62 before subsequent finishing steps.

The addition of an interface layer 62 to maintain the sacrificial columns 82 in place is counter-intuitive because the sacrificial columns 82 are eventually removed. But, premature removal, for whatever reason, reduces the effectiveness and efficiency of the production pillars or junction diodes 22. The interface layer 62 increases the efficiency of production while allowing for subsequent removal of the sacrificial columns 82.

Example 1

The thickness of the interface layer 62 may be in a range between five and ten nanometers, inclusive. The range of widths of the pillars after the clean portion of the fabrication process may be between 53 nm and 69 nm when the interface layer 62 is fabricated from titanium nitride. With respect to this example of the invention, the titanium nitride interface layer 62 may have a ratio of titanium and nitrogen as approximately 1:1. None of the junction diodes 22 fell from the hard mask layer 54 and peeling did not occur.

Example 2

The thickness of the interface layer 62 may be in a range between five and ten nanometers, inclusive. The range of the widths of the pillars after the clean portion of the fabrication process may be between 72 nm and 80 nm when the interface layer 62 is fabricated from tungsten nitride. In this example, a nitrogen flow of 43% was present. None of the junction diodes 22 fell from the hard mask layer 54 and peeling did not occur.

Figure 5D:
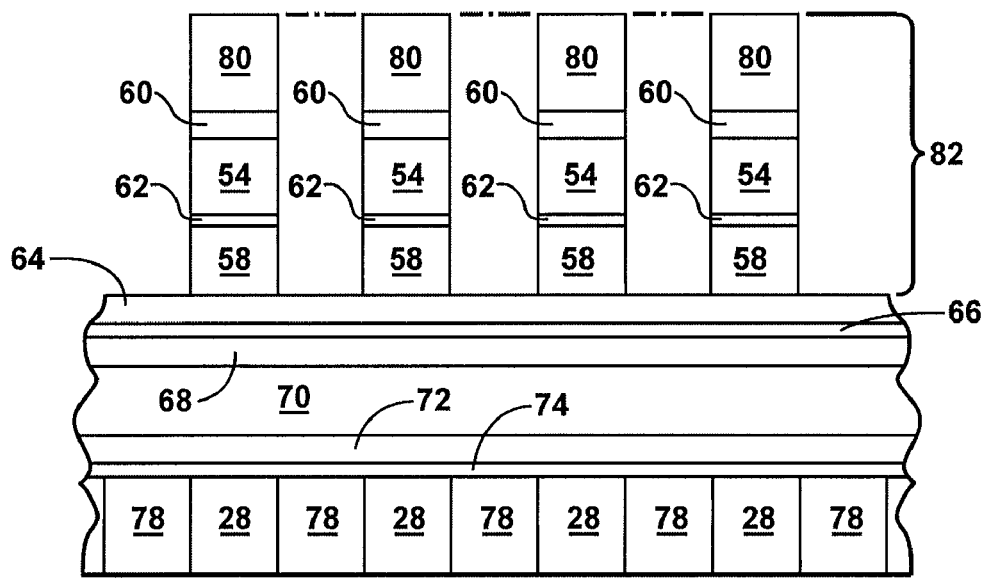

Referring to FIG. 5d, the metal hard mask 58 is etched. The metal hard mask 58 may be etched in a separate step from the other layers due to the differences in the chemistry needed when etching the metal hard mask 58.

Figure 5E:
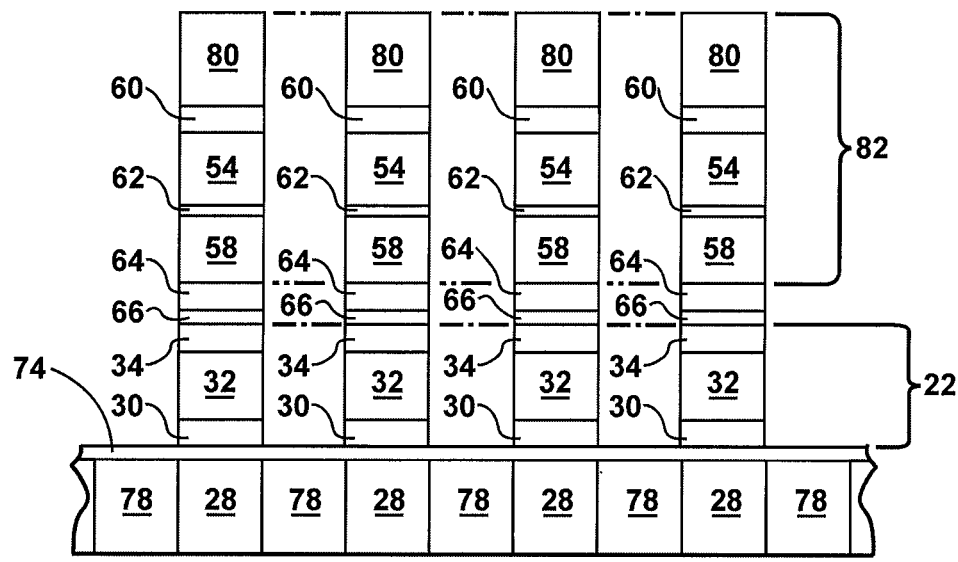

After the metal hard mask 58 has been etched, the junction diodes 22 are formed, as is shown in FIG. 5e. A single etch step forms the dielectric rupture antifuses 24, as well as converts all three layers of silicon 68, 70, 72 into the junction diodes 22 having the heavily doped semiconductor layer 30, the intermediate layer 32 and the heavily doped semiconductor layer 34, as are discussed in greater detail above.

Figure 5F:
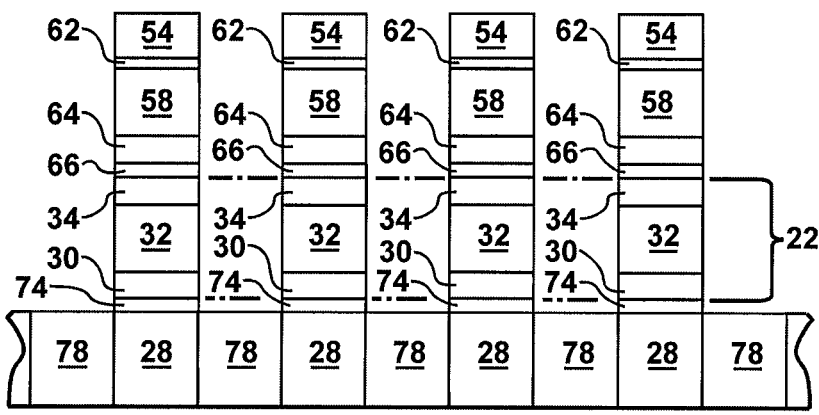

Once the junction diodes 22 and the dielectric rupture antifuses are formed, there is no longer any need for the sacrificial columns 82. These are removed using traditional ash methods. Referring to FIG. 5f, a portion of the sacrificial columns 82 is removed, along with the adhesive layer 74 disposed between the junction diodes 22.

Figure 5G:
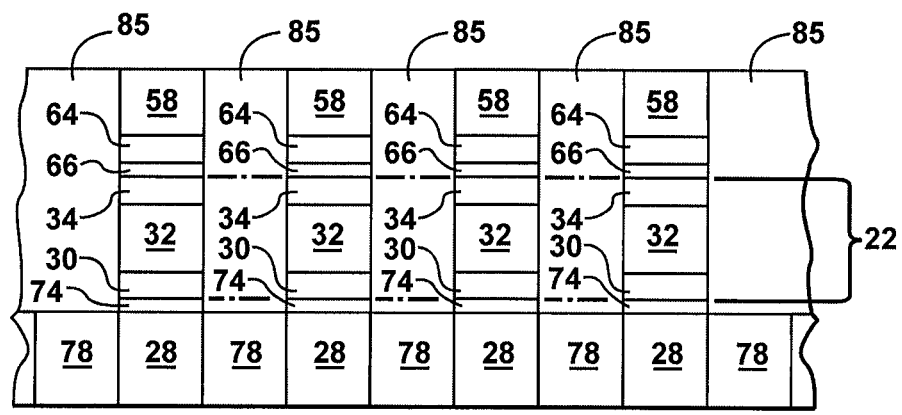

Referring to FIG. 5g, the final step in the formation of the junction diodes 22, disposed between the etched metal hard mask 58 and bottom 28 conductors, is performed. The dielectric rupture antifuse 24 is disposed between the junction diodes 22 and the etched metal hard mask 58. The remainder of the sacrificial column 82 (the interface layer 62 and the remainder of the layer of hard mask 54) are removed using chemical-mechanical planarization (CMP) steps. The layer of hard mask 58 serves as a stop for the CMP process.

Once the junction diodes 22 have been created in pillar form (similar to those shown in FIGS. 1 and 2, the space around the junction diodes is filled with material 85 similar to that of the hard mask 54. This material is non-conductive and provides structural support for the junction diodes 22 throughout the life thereof. Conductive rails (not shown), similar to the top conductors 26, discussed above, are then formed over the junction diodes 22 and are electrically connected thereto through the layer of metal hard mask 58. This step completes the circuit for the junction diodes 22 and the memory cells created thereby.

Throughout this description, one layer has been described as being "above" or "below" another. It will be understood that these terms describe the position of layers and elements relative to the substrate upon which they are formed, in most embodiments a monocrystalline silicon wafer substrate; one feature is above another when it is farther from the wafer substrate, and below another when it is closer. Though clearly the wafer, or the die, can be rotated in any direction, the relative orientation of features on the wafer or die will not change. In addition, the widths of the layers shown are not to scale and are only shown here for illustrative purposes.

The methods for forming the conductors are more fully disclosed in a patent application entitled "Conductive Hard Mask to Protect Patterned Features During Trench Etch," having U.S. Ser. No. 11/444,936, assigned to the assignee of the present invention, the disclosure in which is hereby incorporated by reference.

The invention has been described in an illustrative manner. It is to be understood that the terminology, which has been used, is intended to be in the nature of words of description rather than of limitation.

Many modifications and variations of the invention are possible in light of the above teachings. Therefore, within the scope of the appended claims, the invention may be practiced other than as specifically described.

We claim:

1. A method of fabricating an in-process semiconductor device comprising a sacrificial column, the method comprising:
 depositing a metal hard mask layer over an underlayer;
 depositing a dielectric hard mask layer over the metal hard mask layer;
 depositing a photoresist layer over the dielectric hard mask layer; and
 depositing a first adhesion layer between the metal hard mask layer and the dielectric hard mask layer.

2. The method of claim 1, further comprising depositing a second adhesion layer between the metal hard mask layer and the underlayer.

3. The method of claim 1, further comprising depositing a dielectric anti-reflective coating layer between the dielectric hard mask layer and the photoresist layer.

4. The method of claim 3, wherein the dielectric anti-reflective coating layer prevents off-axis erosion of the photoresist layer that may otherwise occur during subsequent processing steps due to the reflection of light in an etching process.

5. The method of claim 1, wherein the underlayer comprises an antifuse dielectric layer under the metal hard mask layer.

6. The method of claim 5, further comprising depositing a second adhesion layer between the dielectric layer and the metal hard mask layer.

7. The method of claim, 5 further comprising depositing plural semiconductor diode layers under the dielectric layer.

8. The method of claim 7, wherein the plural diode layers comprise silicon.

9. The method of claim 7, wherein the plural diode layers comprise a pn junction.

10. The method of claim 7, wherein the plural diode layers comprise a p-type layer, an n-type layer and an intrinsic semiconductor layer located between the p-layer and the n-layer.

11. The method of claim 1, wherein the metal hard mask layer comprises tungsten or a tungsten alloy.

12. The method of claim 1, wherein the first adhesion layer between the metal hard mask layer and the dielectric hard mask layer comprises titanium nitride or tungsten nitride.

13. The method of claim 1, wherein the first adhesion layer between the metal hard mask layer and the dielectric hard mask layer is between 5-10 nm in thickness.

14. The method of claim 1, wherein the sacrificial column is between 53 and 69 nm in width and the first adhesion layer comprises titanium nitride.

15. The method of claim 1, wherein the sacrificial column is between 72 and 80 nm in width and the first adhesion layer comprises tungsten nitride.

16. A method of making an in-process semiconductor device comprising a column, the method comprising:
   depositing plural semiconductor diode layers;
   depositing an antifuse dielectric layer;
   depositing a metal hard mask layer over the plural semiconductor diode layers and the antifuse dielectric layer;
   depositing a first adhesion layer on the metal hard mask layer; and
   depositing a dielectric hard mask layer on the first adhesion layer.

17. The method of claim 16, further comprising:
   depositing a second adhesion layer between the metal hard mask layer and the antifuse dielectric layer; and
   depositing a dielectric anti-reflective coating layer over the dielectric hard mask layer.

18. The method of claim 17, wherein:
   the metal hard mask layer comprises tungsten or a tungsten alloy; and
   the first adhesion layer comprises titanium nitride or tungsten nitride.

19. The method of claim 18, wherein the plural semiconductor diode layers, the antifuse dielectric layer, the second adhesion layer, the metal hard mask layer, the first adhesion layer, the dielectric hard mask layer, and the dielectric anti-reflective coating in the column each have a cross sectional area equal to a cross sectional area of the column.

20. The method of claim 19, wherein the plural diode layers comprise a p-type layer, an n-type layer and an intrinsic semiconductor layer located between the p-layer and the n-layer.

21. A method of fabricating a semiconductor device, comprising:
   depositing a layer of silicon on a set of conductors;
   depositing a layer of metal hard mask material over the layer of silicon;
   depositing a layer of adhesion material on the layer of metal hard mask material;
   depositing a layer of dielectric hard mask material on the layer of adhesion material;
   depositing a layer of photoresist on the layer of dielectric hard mask material;
   patterning the layer of photoresist to create a photoresist mask pattern;
   etching away a portion of the dielectric hard mask material and the adhesion material using the photoresist mask pattern; and
   etching away a portion of the metal hard mask material to create a plurality of sacrificial columns, the layer of adhesion material between the layer of metal hard mask and the layer of dielectric hard mask having sufficient adhesion to prevent the plurality of sacrificial columns from detaching from the layer of metal hard mask material.

22. A method of claim 21, further comprising etching a layer of conducting material using the plurality of sacrificial columns as a mask pattern.

23. A method of claim 21, further comprising the step of etching the layer of silicon using the plurality of sacrificial columns as a mask pattern to form a plurality of diodes and then removing the sacrificial columns.

24. A method of claim 23, wherein removing the sacrificial columns comprises removing the layer of adhesion material from the layer of metal hard mask material.

25. A method of claim 21, wherein the layer of adhesion material comprises a titanium nitride or tungsten nitride layer.

* * * * *